(12) United States Patent
Lane et al.

(10) Patent No.: US 6,187,442 B1
(45) Date of Patent: *Feb. 13, 2001

(54) THERMOSETTING RESIN COMPOSITIONS, ELECTRICAL LAMINATES OBTAINED THEREFROM AND PROCESS OF PRODUCING THESE

(75) Inventors: Scott Alan Lane, Memphis; Thomas Edward Even, Moscow; Timothy Wayne Austill, Brighton; Philip Andrew Johnson, Collierville, all of TN (US)

(73) Assignee: The Alpha Corporation of Tennessee, Collierville, TN (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/985,185

(22) Filed: Dec. 4, 1997

Related U.S. Application Data

(63) Continuation of application No. 08/483,086, filed on Jun. 7, 1995, now abandoned, which is a continuation-in-part of application No. 08/428,301, filed on Apr. 25, 1995, now abandoned.

(51) Int. Cl.$^7$ ............................ B32B 15/08; B32B 17/04; C08L 63/00; C08L 67/06
(52) U.S. Cl. ........................ 428/416; 427/386; 523/427; 523/466; 525/438; 525/454; 525/524; 525/528; 525/531; 525/111; 525/120
(58) Field of Search ................................... 428/413, 416; 523/459, 516, 427, 466; 525/531, 532, 533, 922, 438, 528, 454, 524, 111, 120

(56) References Cited

U.S. PATENT DOCUMENTS

| | | | |
|---|---|---|---|
| 3,556,928 | 1/1971 | Zolg | 161/186 |
| 3,968,016 * | 7/1976 | Wismer | 525/531 |
| 4,097,994 * | 7/1978 | Reaville et al. | 32/15 |
| 4,203,816 * | 5/1980 | Vargiu et al. | 525/531 |
| 4,310,644 * | 1/1982 | Miley | 525/531 |
| 4,414,367 * | 11/1983 | Gardner | 525/531 |
| 4,569,957 * | 2/1986 | Woelfel | 523/466 |
| 4,587,293 * | 5/1986 | Hefner et al. | 525/531 |
| 4,594,398 * | 6/1986 | Nelson et al. | 525/531 |
| 4,803,115 | 2/1989 | Fushiki et al. | 428/285 |
| 5,015,701 * | 5/1991 | Domeier | 525/922 |
| 5,055,532 * | 10/1991 | Hoffman et al. | 525/530 |
| 5,084,353 * | 1/1992 | Cobbledick et al. | 428/413 |
| 5,085,940 * | 2/1992 | Dion | 428/413 |
| 5,235,008 * | 8/1993 | Hefner, Jr. et al. | 525/532 |
| 5,298,314 | 3/1994 | Even et al. | 428/245 |
| 5,312,691 * | 5/1994 | Even et al. | 428/458 |

FOREIGN PATENT DOCUMENTS

| | | |
|---|---|---|
| 0 739 915 | 10/1996 | (EP). |
| 1 576 583 | 8/1969 | (FR). |
| 2 093 854 | 9/1992 | (GB). |
| 2093854A | 9/1992 | (GB). |

OTHER PUBLICATIONS

Australian Patent Office Search Report, Apr. 25, 1996 (3 pages).
Australian Patent Office Written Opinion, Oct. 8, 1998 (5 pages).
Patent Abstracts of Japan, C–672, p. 127 JP 1–252615 A (Dainippon Ink & Chem Inc) Oct. 9, 1989 (1 page) Abstract.
Patent Abstracts of Japan, C–672, p. 127 JP 1–252614 A (Dainippon Ink & Chem Inc) Oct. 9, 1989 (1 page) Abstract.

* cited by examiner

Primary Examiner—Robert E. L. Sellers
(74) Attorney, Agent, or Firm—Venable; George H. Spencer; Marina V. Schneller

(57) ABSTRACT

The present invention relates to thermosetting resin compositions comprising (a) a first vinyl ester resin synthesized from the diglycidyl ether of bisphenol A, bisphenol A and glacial methacrylic acid, in from about 1% to about 95% by weight of the total composition; (b) a resin selected from the group consisting of (1) a second different vinyl ester synthesized from the diglycidyl ether of bisphenol A with glacial methacrylic acid, and (2) an unsaturated polyester, in from about 1% to about 69% by weight of the total composition; and electrical laminates made therefrom which further comprise a catalyst in from about 0.1% to about 2% by weight of the total composition and which may or may not be clad with an electrical conductive layer on at least one side; and a method of producing these.

47 Claims, 1 Drawing Sheet

THERMOSETTING RESIN COMPOSITIONS, ELECTRICAL LAMINATES OBTAINED THEREFROM AND PROCESS OF PRODUCING THESE

CROSS REFERENCE TO RELATED APPLICATIONS

This application is a continuation of U.S. patent application Ser. No. 08/483,086, abondoned, which is herein incorporated by reference in its entirety. Application Ser. No. 08/483,086 filed Jun. 7, 1995 is, in turn, a continuation-in-part of application of Ser. No. 08/428,301 filed Apr. 25, 1995 entitled "THERMOSETTING RESIN COMPOSITIONS, ELECTRICAL LAMINATES OBTAINED THEREFROM AND PROCESS OF PRODUCING THESE", abandoned, and the benefit of the filing date of same is claimed pursuant to 35 U.S.C. §120. This application is also related to U.S. Pat. No. 5,298,314 filed Sep. 10, 1991; U.S. applications Ser. Nos. 07/756,204 filed, Sep. 10, 1991, U.S. Pat. No. 5,312, 691; 07/756,202 filed Sep. 10, 1991, abandoned; 08/013,320 filed Feb. 4, 1993, abandoned; and 08/367,018 filed Dec. 30, 1994, U.S. Pat. No. 5,985,785. The entire specifications of all of the above are incorporated herein by reference.

BACKGROUND OF THE INVENTION

1. FIELD OF THE INVENTION

The present invention relates to thermosetting resin compositions with excellent electrical properties; electrical laminates made therefrom; and methods of producing these.

2. Technology Review

Electrical laminates such as circuit boards are produced by laminating sheets of electrical conducting material onto a base substrate of insulation material. The performance of the finished circuit board is effected by the electrical characteristics of the base substrate material.

Commercially available thermoset resin systems with acceptable electrical performance at high frequencies (>350 MHZ) are restricted in their applications due to high cost. The lower cost alternatives that are available do not perform satisfactorily at high frequencies due to unacceptable electrical properties, such as high dielectric constant ($D_k$), high dissipation factor ($D_f$), high variability of $D_k$ and $D_f$ with frequency, and consistency of $D_k$ and $D_f$ from lot to lot of production material.

Thermoplastic polymers such as polytetrafluoroethylene (PTFE) which have exceptional electrical performance at high frequencies are commercially available. The primary drawbacks associated with these materials are very high raw material costs and special processing considerations that add substantial cost to the final product. Because of the physical properties, very high laminating temperatures and pressures are also required to fabricate an electrical laminate from PTFE. Furthermore, due to the inability to "wet" PTFE, costly and hazardous chemicals are required to modify its surface during fabrication of the circuit.

A thermoset material would have much greater mechanical properties over a much broader temperature range. Additionally, since thermoset materials have better mechanical properties, this would allow the circuit board fabricator to use conventional cost effective processes.

A need exists for thermosetting resin compositions, and electrical laminates made therefrom, of low to moderate cost with acceptable electrical properties at frequencies up to at least 20 GHz. Such compositions would have great utility as circuit board substrates and the laminates made from these thermosetting resins can be utilized in many applications such as in the rapidly growing wireless communication market, in high speed computers, in high definition televisions, and in various other electrical and related applications.

SUMMARY OF THE INVENTION

An object of the present invention is to provide a thermosetting resin composition which can be made flame retardant and which can be utilized in existing cost effective technologies to manufacture electrical laminates therefrom. Additionally, the present invention resin compositions can have utility as, for example, electrical insulators, encapsulants, insulating adhesives and in various other electrical and related applications generally know to those skilled in this art.

Accordingly, the present invention provides a thermosetting resin composition comprising (a) a first vinyl ester resin synthesized from diglycidyl ether of bisphenol A, bisphenol A, and glacial methacrylic acid, in about 1% to about 95% by weight of the total composition; and (b) a resin selected from the group consisting of (1) a second different vinyl ester synthesized from diglycidyl ether of bisphenol A with glacial methacrylic acid, and (2) an unsaturated polyester, in about 1% to about 69% by weight of the total composition.

The composition resins may also further contain monomers which would, for example, aid in the adhesion of a metal foil to the laminate; increase crosslink density and thermal performance; provide fire retardation, etc. Catalysts which, for example, induce free-radical cure may also be added. Other components may include moisture scavengers, compounds which increase or reduce the dielectric constant, and/or reduce the dissipation factor, polyethylene fillers, other fillers, organic or inorganic, which modify rheology, surface agents, viscosity and performance modifiers, wetting agents, air release agents, defoaming agents, flame retardant synergists, adhesion promoters, and other additional monomers and conventional additives known in the art.

Other objects of the present invention are to provide electrical laminates, and methods for producing these laminates containing the composition resins of the present invention, which have excellent electrical properties and which may be flame retardant or heat resistant. Accordingly, the present invention further provides electrical laminates from about 0.003 inches to about 0.120 inches thick which may or may not be clad with an electrical conducting material on one or both sides.

The electrical laminates of the present invention are produced by impregnating at least one reinforcement substrate with a thermosetting resin composition comprising a mixture of (a) a first vinyl ester resin, synthesized from diglycidyl ether of bisphenol A, bisphenol A, and glacial methacrylic acid, in about 1% to about 95% by weight of the total composition; (b) a resin selected from the group consisting of (1) a second different vinyl ester synthesized from diglycidyl ether of bisphenol A with glacial methacrylic acid, and (2) an unsaturated polyester, in about 1% to about 69% by weight of the total composition; and (c) catalysts which induce free radical cure, polymerization, or U.V. initiation in about 0.1% to about 2.0% by weight of the total composition; and curing the resin impregnated substrate to produce an electrical laminate.

The thermosetting resin composition may also further contain the above mentioned added components and may be cured by electron beam processing, radiation, heat with or without pressure, ultra violet light processing, and other conventional curing methods in conjunction with the appropriate initiators. The electrical laminates may further comprise an electrical conductive cladding on at least one side.

DETAILED DESCRIPTION OF THE INVENTION

Figure 1:
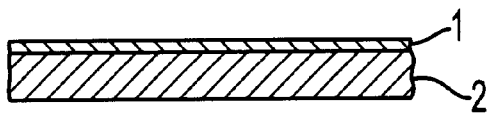
FIG. 1 is an enlarged cross-sectional view of a part of an electrical laminate which comprises an electrically conductive metal layer 1 and a cross linked thin-wall body of the invented composition 2.
Figure 2:
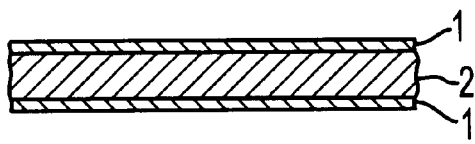
FIG. 2 is an enlarged cross-sectional view of an electrical laminate which exemplifies a double-sided metal clad electrical laminate, further provided with two metal conductive layers 1, and an electrically insulating thin-wall body of the invented composition 2.
Figure 3:
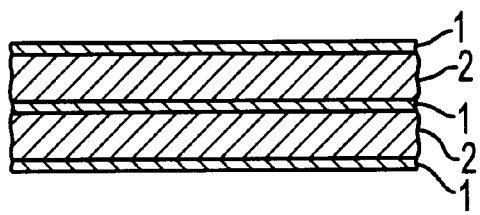
FIG. 3 is an enlarged cross-sectional view of an electrical laminate which exemplifies a multilayered electrical laminate, of the structure of a combination of single-sided and double sided metal clad electrical laminates as illustrated in FIG. 1 and FIG. 2.
Figure 4:
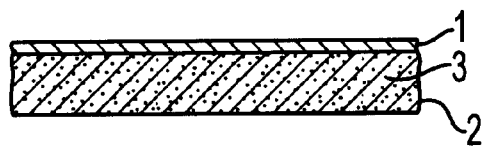
FIG. 4 is an enlarged cross-sectional view of an electrical laminate which comprises an electrically conductive layer 1, a crosslinked thin-wall body of the invented composition 2, and an uniformly dispersed inorganic or organic filler 3.
Figure 5:
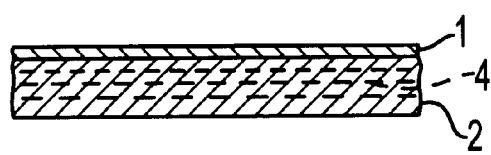
FIG. 5 is an enlarged cross-sectional view of an electrical laminate which comprises an electrically conductive metal layer 1, a crosslinked thin-wall body of invented composition 2, and nonwoven glass fibers 4.
Figure 6:
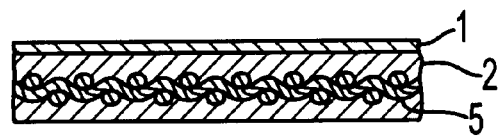
FIG. 6 is an enlarged cross-sectional view of an electrical laminate which comprises an electrically conductive metal layer 1, a crosslinked thin-wall body of invented composition 2, and woven glass cloth 5.
Figure 7:
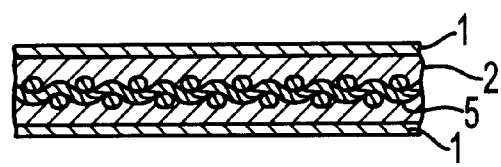
FIG. 7 is an enlarged cross-section view of part of an example of a double-sided metal clad electrical laminate of FIG. 6 further provided with an electrically conductive metal layer 1 on the other surface.
Figure 8:
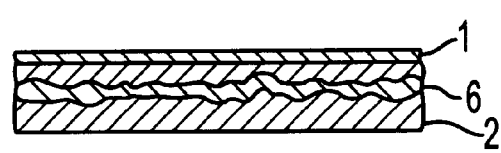
FIG. 8 is an enlarged cross-sectional view of an electrical laminate which comprises an electrically conductive metal layer 1, a crosslinked thin-wall body of the invented composition 2, and an aramid non-woven sheet 6.

The present invention comprises resin compositions of moderate cost with excellent electrical properties up to at least 20 GHz which may be flame retardant and heat resistant. The present compositions have utility as electrical insulators, electrical laminates, electrically insulating encapsulants, electrically insulating adhesives and other electrical and related applications.

A primary component of these compositions is a first vinyl ester resin (referred herein as VE1). VE1 can be about 1% to about 95% by weight of the total composition; preferably about 10% to about 75% by weight of the total composition; more preferably about 15% to about 60% by weight of the total composition and most preferably about 20% to about 40% by weight of the total composition.

A detailed description of the vinyl ester chemistry involved in the production of these vinyl ester resins can be found in U.S. Pat. Nos. 3,221,043 and 3,256,226 to Frank Fekete et al. Both of which are herein incorporated by reference.

An embodiment of the present invention utilizes a vinyl ester which is synthesized from 1.0 molar equivalent of diglycidyl ether of bisphenol A, DGEBPA (such as "EPON 828" from Shell Oil Company, Houston, Tex. ); 0.42 molar equivalents of bisphenol A (BPA): and 0.58 molar equivalents of glacial methacrylic acid (MAA).

This material is synthesized in a two step process. (1) The DGEBPA and BPA are charged into the reactor with a reaction catalyst (such as triphenyl phosphine) under an inert gas blanket. The reactor is heated to 130° C. and held until the weight-per-epoxide (WPE) value is approximately 400. (2) The temperature is dropped to 115° C., and a gas sparge (comprised of nitrogen with about 5% oxygen) is started. At this point, an inhibitor (such as tetrahydroquinone), the MAA, and a reaction catalyst (usually a tertiary amine, such as 2,4,6-tris(dimethylaminomethyl)phenol, also known as "DMP-30") is charged. The reaction conditions are held until the WPE is ≈5000 and the acid number is <10. At the endpoint, the resultant polymer is thinned in styrene at the 70% level (70% polymer).

Other VE1 components which may be utilized in the present invention are also commercially available. Vinyl ester resins identified with the trade name "VE 12-70" from Alpha/Owens-Corning and "DEREKANE 411" from Dow Chemical Co. are examples of such commercially available resins.

A second component of an embodiment of the present invention is preferentially a different vinyl ester (referred herein as VE2). VE2 can be about 1% to about 69% by weight of the total composition; preferably about 5% to about 50% by weight of the total composition; more preferably about 7% to about 30% by weight of the total composition and most preferably about 10% to about 20% by weight of the total composition.

An embodiment of the present invention utilizes a different second vinyl ester comprised of 1.0 molar equivalent of DGEBPA and 1.1 molar equivalents of glacial methacrylic acid which is synthesized in a one step process. The DGEBPA and MAA are charged into the reactor along with an inhibitor (such as a p-benzoquinone) and a reaction catalyst (DMP-30). A nitrogen with ≈5% oxygen sparge is started and the reactor is heated and held at 120° C. until the acid number is <15 and the viscosity is A½ (Gardner-Holt method). At the end-point, the polymer is thinned in styrene at the 70% level (70% polymer).

The second component (VE2) can also be an unsaturated polyester. It can be chosen to further improve electrical properties or another aspect of the composition's performance. One example of such an unsaturated polyester would be composed of 1.0 mole of maleic anhydride, 0.75 moles of diethylene glycol, 0.5 moles of isophthalic acid and 0.83 mole of propylene glycol. The unsaturated polyester would be synthesized through traditional esterification techniques well known throughout the industry. An additional example of a suitable unsaturated polyester would be comprised of 1.0 moles of maleic anhydride, 1.62 moles of propylene glycol, 0.33 moles of isophthalic acid, and 0.67 moles of polyethylene terephthalate (PET). The PET would be incorporated into the resin through a transesterification reaction in the presence of an excess of propylene glycol and reaction catalysts and subsequent processing through traditional esterification methods.

Other VE2 components which may be utilized in the present invention are also commercially available. Vinyl ester resins such as the resin identified with the trade name "VE 15-70" from Alpha/Owens-Corning is one example of such a commercially available resin. Additionally, VE2 unsaturated polyester resins such as "38-62 Resin" are commercially available from Alpha/Owens-Corning.

A third component of a composition of the present invention may be glacial methacrylic acid (referred herein as MAA). MAA can be about 0.1% to about 6% by weight of the total composition; preferably about 0.5% to about 5% by weight of the total composition; more preferably about it to about 4% by weight of the total composition and most preferably about 3% by weight of the total composition. It is utilized as a monomer as it aids the adhesion of the copper foil to the laminate.

A fourth component may be divinyl benzene (referred herein as DVB). DVB can be about 0.1% to about 10% by weight; preferably about 0.5% to about 5% by weight of the total composition; more preferably about 1% to about 4% by weight of the total composition and most preferably about 2.5% by weight of the total composition. Divinyl benzene increases the crosslink density and therefore thermal performance of the composition. Other polyfunctional crosslinking monomers may also be use such as divinyl toluene and the like.

The third and fourth components contribute to the mechanical and thermal properties of a composition but do not need to be present to obtain the excellent electrical properties.

A fifth component may be dibromostyrene (referred herein as DBS). DBS can be about 10% to 70% by weight of the total composition; preferably about 20% to about 60% by weight of the total composition; more preferably about 30% to about 50% by weight of the total composition and most preferably about 40% by weight of the total composition. Dibromostyrene adds fire retardation to the composition and lowers the dissipation factor and dielectric constant. Alternately, any other halogenated vinyl functional monomer (for example, tribromostyrene or pentabromobenzyl acrylate) may also be used.

Catalysts and polymerization and U.V. initiators may also be components of the compositions of the present invention. There are many choices available; particularly, catalyst which induce free-radical cure. The preferred catalysts are t-butyl peroctoate at about 0.1 to about 2% by weight of the total composition (preferably about 0.4% by weight of the total composition); with t-butyl peroxy benzoate at about 0.1 to about 2% by weight of the total composition (preferably 0.25% by weight of the total composition); and dicumyl peroxide at about 0.1 to about 2% by weight of the total composition (preferably 0.25% by weight of the total composition). Alternative catalysts include benzoyl peroxide, cumene hydrogen peroxide and others known to those skilled in this art. Combination of catalysts may also be used. Curing mechanisms may be utilized including electron beam processing and ultra-violet light processing in conjunction with UV initiators, radiation, heating with or without pressure, and other conventional curing methods in conjunction with the appropriate initiators.

Additional components, such as moisture scavengers may also be added. Free moisture in the composition will negatively affect the dissipation factor. Therefore a component, such as 3-ethyl-2-methyl-2-(3-methylbutyl)-1,3-oxazolidine (available from Angus Chemical Co.) can be added to minimize the free water in the composition. The oxazolidine compound will chemically react with the water to eliminate it. Alternately, a molecular sieve could be utilized. Molecular sieves are well known as moisture reducers throughout the coatings industry. Molecular sieves function by physically trapping the free water.

Another additional component may be titanium dioxide which increases the dielectric constant, but reduces the dissipation factor. This combination of electrical properties is desirable for some specific high frequency applications. The titanium dioxide may be in a range of from about 1 to about 60% by weight of the total composition; preferably about 10 to about 40% by weight of the total composition; more preferably about 25% by weight of the total composition.

Another component which may be added is polyethylene filler, (such as expanded polyethylene compound, available from American Fillers and Abrasives). The polyethylene will lower both the dielectric constant and dissipation factor. The polyethylene may be in a range of from about 1 to about 60% by weight of the total composition; preferably about 5 to about 40 % by weight of the total composition; more preferably about 10% by weight of the total composition.

Other optional additives include organic and/or inorganic fillers, for example, calcined kaolin, to modify rheology; surface active agents, to aid processing; other monomers, such as methyl methacrylate to modify viscosity and possibly performance; epoxies; colorants; fluorescent dyes; U.V. blocking agents; wetting agents; air release agents; defoaming agents; flame retardant synergists (for example, antimony compounds); adhesion promoters (for example, epoxy resin "EPON 828" Shell Chemical Co.); additional monomers including styrene, vinyl toluene, t-butyl styrene, paramethyl methyl styrene, diallyl phthalate, 2,4-ethylmethyl imidazole, and other conventional additives.

The present invention further comprises electrical laminates utilizing the thermosetting resin compositions herein described which have excellent electrical properties and which may be flame retardant and heat resistant. The present thermosetting resin compositions can also be utilized in existing cost effective technologies to manufacture various types of electrical laminates. Examples of these technologies include, but are not limited to, continuous lamination, such as that described in U.S. Pat. No. 4,803,022 to Barell et al. which is incorporated herein by reference; production of printed circuit boards, such as described in U.S. Pat. Nos. 4,671,984 and 4,751,146 to Masahiko Maeda et al. which are incorporated herein by reference; production of electrical laminates such as described in U.S. Pat. No. 4,336,297 to Yasuo Fushiki et al. and U.S. Pat. No. 5,009,949 to Kazuyuki Tanaka et al. which are both incorporated herein by reference; continuous belt press lamination, such as the equipment offered by GreCon Corp.; and traditional press or vacuum press lamination.

An electrical laminate of the present invention is produced by infiltrating or impregnating at least one substrate, or multiple substrates, with a resin composition of the present invention to prepare resin-infiltrated or resin-impregnated substrates which are laminated by passage between rolls while removing interlaminar gas bubbles. Subsequently, the resulting laminate is heated, with or without pressure, to cure the resin composition whereby the electrical laminate is obtained. Other cure mechanisms can also be utilized. The electrical laminate of this invention can be continuously produced.

For curing the resin composition, organic peroxides can be used as curing catalysts. The organic peroxides include, for example, t-butyl perbenzoate, t-butyl peroxide, benzoyl peroxide, t-butyl peroctoate, t-butyl peroxy benzoate, dicumyl peroxide, etc. If necessary, the curing can be controlled by use of curing accelerators or polymerization inhibitors. Characteristics of the resin composition can be improved by incorporating thereinto plasticizers, stabilizers, thickeners, fillers, coloring agents, lubricants, etc.

A copper-clad laminate can be obtained by subjecting substrates impregnated with an uncured resin composition and copper foil to laminated molding to unite them in a body, or by inserting an adhesive between substrates impregnated with an uncured resin and copper foil and then subjecting them to laminated molding to unite them in a body. A copper-clad laminate can be obtained by also preparing a laminate by laminate molding and then unite this laminate and a copper foil laminate in a body through an adhesive. Adhesives such as epoxy resins, butyryl-modified epoxy resins, etc. can be used.

The present electrical laminates may be from about 0.001 to about 0.25 inches thick and may be metal clad on one or both sides or not clad in metal. A preferred embodiment is about 0.002 to about 0.20 inches thick. A more preferred embodiment is about 0.003 to about 0.120 inches thick.

Suitable cladding metals include aluminum, silver, gold, brass and most preferably copper. The metal cladding may be in various forms and weight. The weight may range from about 0.25 to about 5 oz/ft$^2$. The form can be any conventional type, such as, foil, an electrodeposited layer or rolled annealed metal, such as for example, rolled annealed copper.

A preferred embodiment comprises a copper clad electrical laminate suitable for subsequent processing as a circuit board, stripline, microstripline microwave components and other related applications. The preferred embodiment of this composition is an electrical laminate from 0.003 to 0.120 inches thick with metal foil clad on one or both sides.

Suitable reinforcement components include organic or inorganic fillers, woven fiberglass, glass paper, glass mat, glass cloth, polyimide paper (such as "THERMOUNT" from DuPont), woven polymeric fibers and non-woven polymer fiber reinforcements and the like. The reinforcement components of the laminates of the present invention may be in the range of about 25% to 75% by weight of the total laminate, preferably about 30% to about 40%, and more preferably about 35%.

The performance of this composition differs from similar materials mainly in electrical performance. These properties, especially dissipation factor, are very important when considering high frequency applications. Typical electrical properties of an 0.030" thick laminate of approximate 32% (by weight) of fiberglass reinforcement are:

| Frequency (GHz): | 0.5 | 0.85 | 1.0 | 2.5 | 3.0 |
|---|---|---|---|---|---|
| Dielectric constant: | 3.233 | 3.237 | 3.204 | 3.213 | 3.231 |
| Dissipation factor: | 0.002 | 0.003 | 0.005 | 0.006 | 0.010 |

The electrical properties of the same laminate at 1 MHz are:
Dielectric constant: 2.98
Dissipation factor: 0.010
This embodiment of the present invention is clearly superior in electrical properties over presently available compositions.

The invention will be further clarified by a consideration of the following examples which are to be considered as illustrative of the present invention. It should be understood that the invention is not limited to the specific details of the examples.

EXAMPLES

The first vinyl ester resins used in the following examples can be made in a two step process according to U.S. Pat. Nos. 3,221,043 and 3,256,226 to Frank Fekete et al. or are commercially available as, for example, "VE 12-70" from Alpha/Owens-Corning. The second vinyl ester resins can also be synthesized in a one step process or are commercially available, for example, from Alpha/Owens-Corning as "VE 15-70". The unsaturated polyester resin used in the examples is also commercially available from Alpha/Owens Corning as "38-62".

The general method of preparing the resin compositions is as follows.

1) The resin components were charged into a mixing vessel in the desired proportions.

2) The monomer(s) and/or halogenated monomers were added to the mixing vessel.

3) The ingredients were mixed with a Cowels blade on an air motor at moderate ($\approx$1,000 rpm) speed for five minutes.

4) With the mixer operating at high speed, ($\approx$2,000 rpm), the filler, if needed, was added, and sheared for 10 minutes.

5. The initiator(s) (peroxides) were added to the composition while the air motor was operating at low speed ($\approx$400 rpm) and mixed for 5 minutes.

Example 1

Approximately 31.78 weight % of a first vinyl ester resin, "VE 12-70" (Alpha/Owens Corning) and about 13.02 weight % of a second vinyl ester resin, "VE 15-70" (Alpha/Owens Corning) were charged into a mixing vessel and about 2.65 weight % of monomer methacrylic acid was added along with about 2.21 weight % divinyl benzene; and about 36.18 weight % dibromostyrene (Great Lakes Chemicals) as a fire retardant. The ingredients were mixed with a Cowels blade on an air motor at moderate ($\approx$1,000 rpm) speed for five minutes. The mixer operating at high speed, (approximately 2,000 rpm), about 13.36 weight percent calcined kaolin ("TRANSLINK-37" Englehard) was then added and sheared for 10 minutes. The speed of the air motor was then reduced to a low speed (approximately 400 rpm) and 0.22 weight a of dicumylperoxide; 0.36 weight % t-butyl peroctoate and 0.22 weight % t-butyl peroxy benzoate were added and the composition was mixed for about 5 minutes. A composition ready for use was obtained.

Example 2

Approximately 35.68 weight % of a first vinyl ester resin, "VE 12-70" (Alpha/Owens Corning) and about 14.62 weight % of a second vinyl ester resin, "VE 15-70" (Alpha/Owens Corning) were charged into a mixing vessel and about 2.73 weight % of styrene monomer was added along with about 2.97 weight % methacrylic acid; 2.48 weight % divinyl benzene; and about 40.62 weight % dibromostyrene (Great Lakes Chemicals) as a fire retardant. The ingredients were mixed with a Cowels blade on an air motor at moderate ($\approx$1,000 rpm) speed for five minutes. Then the speed of the air motor was reduced to operate at a low speed (approximately 400 rpm) and 0.25 weight % of dicumylperoxide; 0.4 weight % t-butyl peroctoate and 0.25 weight % t-butyl peroxy benzoate were added and the composition was mixed for about 5 minutes. A composition ready for use was obtained.

Example 3

Approximately 26.45 weight % of a first vinyl ester resin, "VE 12-70" (Alpha/Owens Corning) and about 8.82 weight % of an unsaturated polyester resin, "38-62" (Alpha/Owens Corning) were charged into a mixing vessel and about 1.24 weight % of monomer methyl methacrylate was added along with about 2.62 weight % "EPON 828" epoxy (Shell Chemical Co.); about 0.05 weight % "EMI 24" (2,4-ethyl-methyl imidazole); about 4.42 weight % methacrylic acid monomer; and about 39.95 weight % dibromostyrene (Great Lakes Chemicals) as a fire retardant. The ingredients were mixed with a Cowels blade on an air motor at moderate (≈1,000 rpm) speed for five minutes. With the mixer operating at high speed, (approximately 2,000 rpm), about 15.44 weight percent calcined kaolin ("TRANSLINK-37" Englehard) was added and sheared for 10 minutes. The speed of the air motor was reduced to operate at a low speed (approximately 400 rpm) and 0.36 weight % of dicumylperoxide; 0.26 weight % t-butyl peroctoate and 0.39 weight % t-butyl peroxy benzoate were added and the composition was mixed for about 5 minutes. The prepared composition was ready for use.

Example 4

Approximately 90.18 weight % of a first vinyl ester resin, "VE 12-70" (Alpha/Owens Corning) and about 9.02 weight % dibromostyrene (Great Lakes Chemicals) were charged into a mixing vessel and mixed with a Cowels blade on an air motor at moderate (about 1,000 rpm) speed for five minutes. The speed of the air motor was reduced to operate at a lower speed (about 400 rpm) and 0.22 weight % of dicumyl peroxide, 0.36 weight % t-butyl peroctoate, and 0.22 weight % t-butyl peroxy benzoate were added and the composition was mixed for 5 minutes. A composition ready for use was produced.

Example 5

Approximately 76.31 weight % of a first vinyl ester resin, "VE 12-70" (Alpha/Owens Corning) and about 22.89 weight % dibromostyrene (Great Lakes Chemicals) were charged into a mixing vessel and mixed with a Cowels blade on an air motor at moderate (about 1,000 rpm) speed for five minutes. The speed of the air motor was reduced to operate at a lower speed (about 400 rpm) and 0.22 weight % of dicumyl peroxide, 0.36 weight % t-butyl peroctoate, and 0.22 weight % t-butyl peroxy benzoate were added and the composition was mixed for 5 minutes. A composition ready for use was produced.

Example 6

Approximately 66.14 weight % of a first vinyl ester resin, "VE 12-70" (Alpha/Owens Corning) and about 33.06 weight % dibromostyrene (Great Lakes Chemicals) were changed into a mixing vessel and mixed with a Cowels blade on an air motor at moderate (about 1,000 rpm) speed for five minutes. The speed of the air motor was reduced to operate at a lower speed (about 400 rpm) and 0.22 weight % of dicumyl peroxide, 0.36 weight % t-butyl peroctoate, and 0.22 weight % t-butyl peroxy benzoate were added and the composition was mixed for 5 minutes. A composition ready for use was produced.

Example 7

Approximately 31.78 weight % of a first vinyl ester resin, "VE 12-70" (Alpha/Owens Corning) and about 13.02 weight % of a second vinyl ester resin, "VE 15-70" (Alpha/Owens Corning) were charged into a mixing vessel and about 36.18 weight % of styrene monomer was added along with about 2.65 weight % methacrylic acid; and 2.21 weight % divinyl benzene. The ingredients were mixed with a Cowels blade on an air motor at moderate (≈1,000 rpm) speed.

With the mixer operating at high speed, (approximately 2,000 rpm), about 13.36 weight percent calcined kaolin ("TRANSLINK-37" Englehard) was added and sheared for 10 minutes. The speed of the air motor was reduced to operate at a low speed (approximately 400 rpm) and 0.22 weight % of dicumylperoxide; 0.36 weight % t-butyl peroctoate and 0.22 weight % t-butyl peroxy benzoate were added and the composition was mixed for about 5 minutes. A composition ready for use was obtained.

Examples 8 to 15

The general method of preparing electrical laminates from the resin compositions is as follows. The specific electrical laminates embodied in Examples 8 to 15 were made from the resin compositions of Examples 1 to 3 and were prepared as indicated below and as further indicated in TABLE 2 which follows below.

1) A layer of carrier film, such as polyethylene terephthalate of 1.42 mills thick, was placed on an ¼th inch thick glass plate of 1.25 by 1.25 ft. The dimensions of the film were large enough to protrude around the edges of the glass plate.

2) A one foot square piece of 1 oz. per sq. foot weight of copper foil was placed treatment side up on the carrier film.

3) A film of a resin composition, prepared according to the present invention, was metered onto the copper foil by using a wire-wound rod designed to provide a coating of the target thickness of the laminate. Wire-wound rods are well known through the coatings industry.

4) A layer of glass cloth, woven or nonwoven, was laid onto the resin film and allowed to saturate for approximately 2 minutes. If a plurality of layers were used, the layers were placed onto the resin film approximately 2 minutes apart to allow the resin mixture to saturate the glass.

5) An additional layer of copper foil, of the same size and weight as 2), was placed treatment side down on the laminate so as to align the edges with the first sheet of copper foil.

6) Another layer of carrier film, of the same size and dimensions as 1), was placed on top of the copper foil.

7) Two ½ inch wide by 12 inches long shims of the target laminate thickness were placed on opposing sides of the laminate, on top of the carrier film, but still on the glass plate.

8) A rod of ½ inch thick steel was placed on the shims at one edge of the laminate and gently pulled to the opposing edge while being forced by hand to ride on the shims. As the rod moved across the laminate, excess resin composition was allowed to drain out of the laminate.

9) Another plate of glass of equivalent dimensions as 1), was placed on top of the laminate.

10) The laminate was placed in a forced air convection oven at 150° C. for one hour.

11) The laminate, still between the glass plates, was removed from the oven and allowed to cool to room temperature. At this time, the two glass plates and two layers of carrier film were removed.

TABLE 2 indicates the particular laminate construction and resin compositions used in Examples 8 to 15. The resins A, B and C correspond to those of Examples 1, 2 and 3 respectively.

The test method used to determine the electrical properties above 1 MHz was a 70 ohm transmission line test method. It is analogous to ASTM D 3380-90 from the American Society for Testing Materials, Philadelphia, Pa.

TABLE 1

Properties of Neat (unreinforced) Composition
*Electrical Properties @ 1 MHZ

| Example | Sample | Dielectric Constant | Dissipation Factor |
|---|---|---|---|
| 1 | A | 2.93 | 0.010 |
| 2 | B | 3.06 | 0.010 |
| 3 | C | 3.18 | 0.011 |
| 4 | D | 2.97 | 0.014 |
| 5 | E | 2.99 | 0.012 |
| 6 | F | 2.95 | 0.009 |
| 7 | G | 2.73 | 0.007 |

Properties of 30% Glass Reinforced Laminate

| Example | Flame Test | Foil Adhesion | Tg |
|---|---|---|---|
| 1 | Pass | 6.8 | 155 |
| 2 | Pass | 7.2 | 155 |
| 3 | Pass | 7.5 | 145 |

*Electrical Properties via IPC test method 2.5.5.4, "Dielectric Constant and Dissipation Factor of Printing Wiring Board Materials: Micrometer Method"
Flame Test according to U.L. Test 94V0
Copper Foil Adhesion to 1 oz. per sq. foot copper foil according to IPC Test Method IPC-TM-650
Tg = Glass Transition measured by Dynamic Mechanical Analyzer (Perkin Elmer DMA7E). Glass transition values are in degrees Celsius.

TABLE 2

High Frequency Electrical Properties of Glass Reinforced Laminates Which Are Double Sided Cladded With ½ oz/square foot of Copper.
The laminates measure 0.030" thick without copper cladding. Electrical properties of the glass reinforced laminates are determined via a "Microstripline" Method.
NOTE: Dk = Dielectric Constant    Df = Dissipation Factor

| Examples | Resin Composition | Laminate Construction | Dk | Df |
|---|---|---|---|---|
| | | 0.5 GHz | | |
| 8 | A (Example 1) | 2 plies 2116 woven glass with 15 mil veil glass core | 3.233 | 0.0022 |
| 9 | B (Example 2) | 2 plies 2116 woven glass with 15 mil veil glass core | 3.134 | 0.0028 |
| 10 | C (Example 3) | 4 plies 7624 woven glass | 2.977 | 0.0064 |
| 11 | A (Example 1) | 4 plies 7624 woven glass | 3.031 | 0.0062 |
| 12 | A (Example 1) | 3 plies 7624 woven glass | 2.941 | 0.0085 |
| 13 | B (Example 2) | 3 plies 7624 woven glass | 3.066 | 0.0057 |
| 14 | B (Example 2) | 2 plies 7624 woven glass with 15 mil veil glass core | 3.231 | 0.0022 |
| 15 | A (Example 1) | 2 plies 7624 woven glass with 15 mil veil glass core | 3.167 | 0.0057 |
| | | 0.85 GHz | | |
| 8 | A (Example 1) | 2 plies 2116 woven glass with 15 mil veil glass core | 3.237 | 0.0033 |
| 9 | B (Example 2) | 2 plies 2116 woven glass with 15 mil veil glass core | 3.105 | 0.0048 |
| 10 | C (Example 3) | 4 plies 7624 woven glass | 2.993 | 0.0061 |
| 11 | A (Example 1) | 4 plies 7624 woven glass | 2.967 | 0.0064 |
| 12 | A (Example 1) | 3 plies 7624 woven glass | 3.008 | 0.0098 |
| 13 | B (Example 2) | 3 plies 7624 woven glass | 3.065 | 0.0078 |
| 14 | B (Example 2) | 2 plies 7624 woven glass with 15 mil veil glass core | 3.234 | 0.0038 |
| 15 | A (Example 1) | 2 plies 7624 woven glass with 15 mil veil glass core | 3.134 | 0.0069 |
| | | 1.0 GHz | | |
| 8 | A (Example 1) | 2 plies 2116 woven glass with 15 mil veil glass core | 3.204 | 0.0056 |
| 9 | B (Example 2) | 2 plies 2116 woven glass with 15 mil veil glass core | 3.048 | 0.0121 |
| 10 | C (Example 3) | 4 plies 7624 woven glass | 2.968 | 0.155 |
| 11 | A (Example 1) | 4 plies 7624 woven glass | 2.908 | 0.0197 |
| 12 | A (Example 1) | 3 plies 7624 woven glass | 2.962 | 0.0172 |
| 13 | B (Example 2) | 3 plies 7624 woven glass | 3.048 | 0.0122 |
| 14 | B (Example 2) | 2 plies 7624 woven glass with 15 mil veil glass core | 3.196 | 0.0068 |
| 15 | A (Example 1) | 2 plies 7624 woven glass with 15 mil veil glass core | 3.156 | 0.0085 |
| | | 2.5 GHz | | |
| 8 | A (Example 1) | 2 plies 2116 woven glass with 15 mil veil glass core | 3.213 | 0.0062 |
| 9 | B (Example 2) | 2 plies 2116 woven glass with 15 mil veil glass core | 3.113 | 0.0112 |
| 10 | C (Example 3) | 4 plies 7624 woven glass | 3.034 | 0.016 |
| 11 | A (Example 1) | 4 plies 7624 woven glass | 3.034 | 0.0182 |
| 12 | A (Example 1) | 3 plies 7624 woven glass | 2.981 | 0.0162 |
| 13 | B (Example 2) | 3 plies 7624 woven glass | 2.957 | 0.0127 |
| 14 | B (Example 2) | 2 plies 7624 woven glass with 15 mil veil glass core | 3.163 | 0.0062 |
| 15 | A (Example 1) | 2 plies 7624 woven glass with 15 mil veil glass core | 2.987 | 0.0097 |
| | | 3.0 GHz | | |
| 8 | A (Example 1) | 2 plies 2116 woven glass with 15 mil veil glass core | 3.231 | 0.0105 |
| 9 | B (Example 2) | 2 plies 2116 woven glass with 15 mil veil glass core | 3.202 | 0.0169 |
| 10 | C (Example 3) | 4 plies 7624 woven glass | 3.022 | 0.027 |

TABLE 2-continued

High Frequency Electrical Properties of Glass Reinforced Laminates Which Are Double Sided Cladded With ½ oz/square foot of Copper.
The laminates measure 0.030" thick without copper cladding. Electrical properties of the glass reinforced laminates are determined via a "Microstripline" Method.
NOTE: Dk = Dielectric Constant    Df = Dissipation Factor

| Examples | Resin Composition | Laminate Construction | Dk | Df |
|---|---|---|---|---|
| 11 | A (Example 1) | 4 plies 7624 woven glass | 3.034 | 0.024 |
| 12 | A (Example 1) | 3 plies 7624 woven glass | 3.081 | 0.0311 |
| 13 | B (Example 2) | 3 plies 7624 woven glass | 3.065 | 0.0216 |
| 14 | B (Example 2) | 2 plies 7624 woven glass with 15 mil veil glass core | 3.227 | 0.011 |
| 15 | A (Example 1) | 2 plies 7624 woven glass with 15 mil veil glass core | 3.013 | 0.0180 |
| | | 5.0 GHz | | |
| 8 | A (Example 1) | 2 plies 2116 woven glass with 15 mil veil glass core | 3.245 | 0.0011 |
| 9 | B (Example 2) | 2 plies 2116 woven glass with 15 mil veil glass core | 3.200 | 0.0011 |
| 10 | C (Example 3) | 4 plies 7624 woven glass | | |
| 11 | A (Example 1) | 4 plies 7624 woven glass | | |
| 12 | A (Example 1) | 3 plies 7624 woven glass | | |
| 13 | B (Example 2) | 3 plies 7624 woven glass | | |
| 14 | B (Example 2) | 2 plies 7624 woven glass with 15 mil veil glass core | | |
| 15 | A (Example 1) | 2 plies 7625 woven glass with 15 mil veil glass core | | |
| | | 10.0 GHz | | |
| 8 | A (Example 1) | 2 plies 2116 woven glass with 15 mil veil glass core | 3.289 | 0.0017 |
| 9 | B (Example 2) | 2 plies 2116 woven glass with 15 mil veil glass core | 3.235 | 0.0018 |
| 10 | C (Example 3) | 4 plies 7624 woven glass | | |
| 11 | A (Example 1) | 4 plies 7624 woven glass | | |
| 12 | A (Example 1) | 3 plies 7624 woven glass | | |
| 13 | B (Example 2) | 3 plies 7624 woven glass | | |
| 14 | B (Example 2) | 2 plies 7624 woven glass with 15 mil veil glass core | | |
| 15 | A (Example 1) | 2 plies 7624 woven glass with 15 mil veil glass core | | |
| | | 15.0 GHz | | |
| 8 | A (Example 1) | 2 plies 2116 woven glass with 15 mil veil glass core | 3.295 | 0.0026 |
| 9 | B (Example 2) | 2 plies 2116 woven glass with 15 mil veil glass core | 3.256 | 0.0034 |
| 10 | C (Example 3) | 4 plies 7624 woven glass | | |
| 11 | A (Example 1) | 4 plies 7624 woven glass | | |
| 12 | A (Example 1) | 3 plies 7624 woven glass | | |
| 13 | B (Example 2) | 3 plies 7624 woven glass | | |
| 14 | B (Example 2) | 2 plies 7624 woven glass with 15 mil veil glass core | | |
| 15 | A (Example 1) | 2 plies 7624 woven glass with 15 mil veil glass core | | |
| | | 20.0 GHz | | |
| 8 | A (Example 1) | 2 plies 2116 woven glass with 15 mil veil glass core | 3.222 | 0.0056 |
| 9 | B (Example 2) | 2 plies 2116 woven glass with 15 mil veil glass core | 3.201 | 0.0058 |
| 10 | C (Example 3) | 4 plies 7624 woven glass | | |
| 11 | A (Example 1) | 4 plies 7624 woven glass | | |
| 12 | A (Example 1) | 3 plies 7624 woven glass | | |
| 13 | B (Example 2) | 3 plies 7624 woven glass | | |
| 14 | B (Example 2) | 2 plies 7624 woven glass with 15 mil veil glass core | | |
| 15 | A (Example 1) | 2 plies 7624 woven glass with 15 mil veil glass core | | |

Although the invention has been described in conjunction with specific embodiments, it is evident that many alternatives and variations will be apparent to those skilled in the art in light of the foregoing description.

Accordingly, the invention is intended to embrace all of the alternatives and variations that fall within the spirit and scope of the appended claims.

We claim:

1. A thermosetting resin composition, comprising:
   (a) a first vinyl ester resin synthesized from the diglycidyl ether of bisphenol A, bisphenol A and glacial methacrylic acid, in from about 1% to about 95% by weight of the total composition;
   (b) a resin selected from the group consisting of (1) a second different vinyl ester synthesized from diglycidyl ether of bisphenol A with an excess of glacial methacrylic acid, and in about 1% to about 69% by weight of the total composition; and,
   (c) a halogenated vinyl functional monomer in from about 10% to about 70% by weight of the total composition.

2. The composition according to claim 1 further comprising a catalyst in from about 0.1% to about 2% by weight of the total composition.

3. The composition according to claim 2 wherein the catalyst is selected from the group consisting of t-butyl peroctoate, t-butyl peroxy benzoate, dicumyl peroxide, benzoyl peroxide, cumene hydrogen peroxide, t-butyl perbenzoate, t-butyl peroxide and combinations thereof.

4. The composition according to claim 3 wherein the catalyst comprises t-butyl peroctoate in from about 0.4% by weight of the total composition.

5. The composition according to claim 3 wherein the catalyst comprises t-butyl peroxy benzoate in from about 0.25% by weight of the total composition.

6. The composition according to claim 3 wherein the catalyst comprises dicumyl peroxide in from about 0.25% by weight of the total composition.

7. The composition of claim 1 wherein the halogenated vinyl functional monomer comprises from about 20% to about 60% by weight of the total composition.

8. The composition of claim 1 wherein the halogenated vinyl functional monomer comprises from about 30% to about 50% by weight of the total composition.

9. The composition of claim 1 wherein the halogenated vinyl functional monomer is selected from the group consisting of bromostyrene, dibromostyrene, tribromostyrene and pentabromobenzyl acrylate.

10. The composition according to claim 1 further comprising glacial methacrylic acid in from about 0.1% to about 6% by weight of the total composition.

11. The composition according to claim 10 wherein the glacial methacrylic acid is from about 0.5% to about 5% by weight of the total composition.

12. The composition according to claim 10 wherein the glacial methacrylic acid is from about 1% to about 4% by weight of the total composition.

13. The composition of claim 1 further comprising divinyl benzene in from about 0.11 to about 10% by weight of the total composition.

14. The composition of claim 13 wherein the divinyl benzene is from about 0.5% to about 5% by weight of the total composition.

15. The composition of claim 14 wherein the divinyl benzene is from about 1% to about 4% by weight of the total composition.

16. The composition of claim 1 further comprising additives selected from the group consisting of moisture scavengers, molecular sieves, organic fillers, inorganic fillers, oxides effecting dielectric constant or dissipation factor, polyethylene, rheology modification fillers other than said organic and inorganic fillers, surface active agents, monomers which modify viscosity and performance (other than styrene, vinyl toluene, t-butyl-styrene, paramethyl styrene, diallyl phthalate, 2,4-ethyl-methylimidazole and 3-ethyl-2-methyl-2-(3-methylbutyl)-1,3-oxazolidine) colorants other than fouorescent dyes, fluorescent dyes, U.V. blockers, wetting agents, air release agents, defoamers, adhesion promoters, flame retardants other than halogenated vinyl functional monomer, styrene, vinyl toluene, t-butyl-styrene, paramethyl styrene, diallyl phthalate, 2,4,ethyl-methylimidazole, 3-ethyl-2-methyl-2-(3-methylbutyl)-1,3-oxazolidine and combinations thereof.

17. The composition of claim 16 wherein the oxide effecting dielectric constant or dissipation factor comprises titanium dioxide.

18. The composition of claim 16 wherein the polyethylene comprise expanded polyethylene compounds.

19. The composition of claim 16 wherein the rheology modification filler is calcined kaolin.

20. The composition of claim 16 wherein the monomer which modifies viscosity and performance comprises methyl methacrylate.

21. A flame retardant thermosetting resin composition, comprising:
(a) a vinyl ester resin, synthesized from diglycidyl ether of bisphenol A, bisphenol A and glacial methacrylic acid, in from about 1% to about 95% by weight of the total composition;
(b) a resin selected from the group consisting of (1) a different vinyl ester synthesized from diglycidyl ether of bisphenol A with an excess of glacial methacrylic acid, and in from about 1% to about 69% by weight of the total composition;
(c) a halogenated vinyl functional monomer, in from about 10% to about 70% by weight of the total composition; and
(d) a catalyst in from about 0.1% to about 2% by weight of the total composition.

22. The composition according to claim 21 further comprising glacial methacrylic acid in from about 0.1% to about 6% by weight of the total composition.

23. The composition of claim 22 further comprising divinyl benzene in from about 0.1% to about 10% of the total weight of the composition.

24. The composition of claim 23 further comprising additives selected from the group consisting of moisture scavengers, molecular sieves, organic fillers, inorganic fillers, oxides effecting dielectric constant or dissipation factor, polyethylene, rheology modification fillers other than said organic and inorganic fillers, surface active agents, monomers which modify viscosity and performance (other than styrene, vinyl toluene, t-butyl-styrene, paramethyl styrene, diallyl phthalate, 2,4-ethyl-methylimidazole, 3-ethyl-2-methyl-2-(3-methylbutyl)-1,3-oxazolidine) and methyl methacrylate, colorants other than fluorescent dyes, fluorescent dyes, U.V. blockers, wetting agents, air release agents, defoamers, adhesion promoters, epoxies, flame retardants other than said halogenated vinyl functional monomer styrene, vinyl toluene, t-butyl-styrene, paramethyl styrene, diallyl phthalate, 2,4,-ethyl-methylimidazole, 3-ethyl-2-methyl-2-(3-methylbutyl)-1,3-oxazolidine, methyl methacrylate, and combinations thereof.

25. The composition of claim 24 wherein the filler which modifies rheology is calcined kaolin.

26. The composition of claim 24 wherein the monomer which modifies viscosity and performance comprises methyl methacrylate.

27. The composition according to claim 21 wherein the catalyst is selected from the group consisting of t-butyl peroctoate, t-butyl peroxy benzoate, dicumyl peroxide, benzoyl peroxide, cumene hydrogen peroxide, t-butyl perbenzoate, t-butyl peroxide and combinations thereof.

28. The composition according to claim 24 wherein the catalyst is selected from the group consisting of t-butyl peroctoate, t-butyl peroxy benzoate, dicumyl peroxide, benzoyl peroxide, cumene hydrogen peroxide, t-butyl perbenzoate, t-butyl peroxide and combinations thereof.

29. The composition of claim 1 wherein the first vinyl ester is from about 10% to about 75% by weight of the total composition.

30. The composition of claim 1 wherein the first vinyl ester is from about 15% to about 60% by weight of the total composition.

31. The composition of claim 1 wherein the first vinyl ester is from about 20% to about 40% by weight of the total composition.

32. The composition of claim 1 wherein the second vinyl ester is from about 5% to about 50% by weight of the total composition.

33. The composition of claim 1 wherein the second vinyl ester is from about 7% to about 30% by weight of the total composition.

34. The composition of claim 1 wherein the second vinyl ester is from about 10% to about 20% by weight of the total composition.

35. A method for producing electrical insulators, electrical laminates, electrically insulating encapsulants and electrically insulating adhesives, comprising applying the composition of claim 1 to at least one surface of at least one reinforcement substrate.

36. A method for producing electrical insulators, electrical laminates, electrically insulating encapsulants and electrically insulating adhesives, comprising applying the composition of claim 21 to at least one surface of at least one reinforcement substrate.

37. A thermosetting resin composition, comprising:
   (a) a first vinyl ester resin synthesized from diglycidyl ether of bisphenol A, bisphenol A and glacial methacrylic acid, in from about 1% to about 32% by weight of the total composition;
   (b) a second vinyl ester resin synthesized from diglycidyl ether of bisphenol A with an excess of glacial methacrylic acid, in from about 1% to about 32% by weight of the total composition; and,
   (c) brominated styrene monomer in from about 37% to about 98% by weight of the total composition.

38. The composition according to claim 1, wherein the resin (b) is a product formed from a reaction mixture comprising a 1.0 molar equivalent of diglycidyl ether bisphenol A and 1.1 molar equivalent of glacial methacrylic acid.

39. The composition according to claim 21, wherein the resin (b) is a product formed from a reaction mixture comprising a 1.0 molar equivalent of diglycidyl ether bisphenol A and 1.1 molar equivalent of glacial methacrylic acid.

40. The composition according to claim 38, wherein the halogenated vinyl monomer is selected from the group consisting of dibromostyrene, tribromostyrene and pentabromobenzyl acrylate.

41. The composition according to claim 39, wherein the halogenated vinyl monomer is selected from the group consisting of dibromostyrene, tribromostyrene and pentabromobenzyl acrylate.

42. The composition of claim 40, wherein said halogenated vinyl monomer is effective to lower the dissipation factor and dielectric constant.

43. The composition of claim 41, wherein said halogenated vinyl monomer is effective to lower the dissipation factor and dielectric constant.

44. A laminate comprising a layer of copper and a cured layer of the composition of claim 1.

45. A laminate comprising a layer of copper and a cured layer of the composition of claim 21.

46. A laminate comprising a copper substrate and a cured layer of the composition of claim 38.

47. A laminate comprising a copper substrate and a cured layer of the composition of claim 39.

* * * * *